(12) United States Patent
Lin

(10) Patent No.: US 12,283,965 B1
(45) Date of Patent: Apr. 22, 2025

(54) CHARGE PUMP FOR FRACTIONAL-N FREQUENCY SYNTHESIZER

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 18/402,838

(22) Filed: Jan. 3, 2024

(51) Int. Cl.
*H03L 7/197* (2006.01)
*H03L 7/089* (2006.01)
*H03L 7/093* (2006.01)

(52) U.S. Cl.
CPC .......... *H03L 7/1974* (2013.01); *H03L 7/0891* (2013.01); *H03L 7/093* (2013.01)

(58) Field of Classification Search
CPC ...... H03L 7/1974; H03L 7/0891; H03L 7/093
See application file for complete search history.

(56) References Cited

U.S. PATENT DOCUMENTS

| | | | | |
|---|---|---|---|---|
| 5,546,553 | A * | 8/1996 | Robertson | G09G 5/395 345/568 |
| 7,629,854 | B2 | 12/2009 | Lin | |
| 10,594,329 | B1 * | 3/2020 | Elkholy | H03M 3/344 |
| 10,715,155 | B1 * | 7/2020 | Parvizi | H03L 7/089 |
| 10,819,353 | B1 * | 10/2020 | Monk | H03L 7/23 |
| 10,833,682 | B1 * | 11/2020 | Monk | H03L 7/0992 |
| 10,895,850 | B1 * | 1/2021 | Elkholy | G04F 10/005 |
| 11,418,205 | B1 * | 8/2022 | Schwarz | H03L 7/0992 |
| 2007/0126514 | A1 * | 6/2007 | Lin | H03L 7/0891 331/16 |
| 2014/0266343 | A1 * | 9/2014 | Song | H03L 7/0802 327/157 |
| 2020/0195261 | A1 * | 6/2020 | Khoury | H03L 7/1974 |
| 2022/0149849 | A1 * | 5/2022 | Lin | H03L 7/1976 |

(Continued)

FOREIGN PATENT DOCUMENTS

| | | | | |
|---|---|---|---|---|
| CN | 107634759 | B | * 7/2020 | |
| CN | 118282390 | A | * 7/2024 | H03L 7/081 |

(Continued)

OTHER PUBLICATIONS

Menninger et al., "A fractional-N frequency synthesizer architecture utilizing a mismatch compensated PFD/DAC structure for reduced quantization-induced phase noise," IEEE Transactions on Circuits and Systems II: Analog and Digital Signal Processing (vol. 50, Issue: 11, Nov. 2003).

*Primary Examiner* — Adam D Houston
(74) *Attorney, Agent, or Firm* — McClure, Qualey & Rodack, LLP

(57) ABSTRACT

A charge pump includes a DAC (digital-to-analog converter) configured to draw a first current and a second current from a first node and a second node, respectively, in accordance with a first logical signal, a second logical, and a B-bit control word; a common-gate amplifier configured to provide a path for charge transfer between the second node and a third node in accordance with a third logical signal; an integrating capacitor connected to the second node and configured to be either discharged by the DAC or charged by the common-gate amplifier in accordance with a fourth logical signal; and a low-impedance active load connected to the first node.

12 Claims, 7 Drawing Sheets

(56) References Cited

U.S. PATENT DOCUMENTS

| | | | |
|---|---|---|---|
| 2022/0224348 A1* | 7/2022 | Perrott | H03L 7/093 |
| 2023/0126891 A1* | 4/2023 | Geetla | H03L 7/0995 |
| | | | 375/376 |
| 2024/0162906 A1* | 5/2024 | Elmallah | H03L 7/1075 |

FOREIGN PATENT DOCUMENTS

| | | | | |
|---|---|---|---|---|
| EP | 1793499 A1 * | 6/2007 | | H03L 7/0891 |
| KR | 20230031586 A * | 3/2023 | | |

* cited by examiner

CHARGE PUMP FOR FRACTIONAL-N FREQUENCY SYNTHESIZER

BACKGROUND OF THE INVENTION

Field of the Invention

The present invention generally relates to charge pumps for fractional-N frequency synthesizer and particularly to charge pumps of low noise and low nonlinearity for frequency synthesizer.

Description of Related Art

Persons of ordinary skill in the art understand terms and basic concepts related to microelectronics that are used in the context of this disclosure, such as "voltage," "current," "signal," "logical signal," "clock," "phase," "(clock) edge," "capacitor," "transistor," "NMOST (n-channel metal-oxide semiconductor transistor)," "source," "gate," "drain," "node," "ground node," "power supply node," "inverter," "DFF (data flip-flop)" "common-gate amplifier," "load," "impedance," "noise," and "nonlinearity." Terms and basic concepts like these in the context of this present disclosure are apparent to those of ordinary skill in the art and thus will not be explained in detail.

Those of ordinary skill in the art can recognize a resistor symbol, a capacitor symbol, and a NMOST (n-channel metal-oxide semiconductor transistor) symbol, and can identify a "source" terminal, a "gate" terminal, a "drain" terminal, and a "body" terminal of a NMOST. For brevity, in this present disclosure, in a context of reference to a NMOST, a "source terminal" is simply referred to as "source," a "gate terminal" is simply referred to as "gate," and a "drain terminal" is simply referred to as "drain." A NMOST has a threshold voltage and is turned on when a gate-to-source voltage is greater than the threshold voltage.

Those of ordinary skill in the art can read schematics of a circuit comprising resistors, capacitors, NMOST, inverter, DFF, and so on, and do not need a description about how one of them connects with another in the schematics.

As shown in FIG. 1, a PLL (phase lock loop) 100 comprises a PFD (phase/frequency detector) 110, a CP (charge pump) 120, a LP (loop filter) 130, a VCO (voltage-controlled oscillator) 140, and a MMD (multi-modulus divider) 150. The PFD 110 detects a timing (which is a time at which a rising edge occurs) difference between a reference clock and a divided clock and outputs two logical signals UP (which stands for "up") and DN (which stand for "down") to represent the timing difference. Each time a detection is taken by the PFD 110, a pulse of UP is generated if the reference clock is ahead of the divided clock in the timing, and a pulse of DN is generated if the divided clock is ahead of the reference clock in the timing, wherein a width of the pulse of UP or the pulse of DN is proportional to the timing difference that is detected. The CP 120 receive UP and DN and output an error current to represent the timing difference, such that the error current is of positive polarity if the reference clock is ahead of the divided clock in the timing, and of negative polarity if the divided clock is ahead of the reference clock in the timing, and a net charge of the error current, which is an integral of the error current, is proportional to the timing difference. The LP 130 receives the error current and establishes a control voltage that controls the VCO 140, which outputs an VCO clock. The MMD 150 receives the VCO clock and output the divided clock in accordance with a divisor value N, such that a pulse of the divided clock is generated for every N cycles of the VCO clock. A closed-loop control system is thus established to adjust the frequency/phase of the VCO clock to track the frequency/phase of the reference clock, and a frequency of the VCO clock will be N times of a frequency of the reference clock. PLL 100 is well known in the prior art and thus not further described in detail here.

In practice, the CP 120 is subject to a nonlinearity resulting from an issue known as "P-N mismatch," wherein a magnitude of the error current in response to a UP pulse is different from the magnitude of the error current in response to a DN pulse. To avoid this issue, a fixed current of positive polarity is injected into the LF 130 to pull ahead the VCO clock timing and force the timing of the divided clock to be always ahead of the timing of the reference clock in a steady state; this way, the PFD 110 will output DN pulse exclusively and the error current will always be of negative polarity. (There might be a very short UP pulse due to circuit implementation limitation of a PFD circuit that does not allow an UP pulse of zero width, but an effect of the very short UP pulse is negligible and thus neglected in this present disclosure.) For the rest of this disclosure, this scenario is assumed, wherein the divided clock is always ahead of the reference clock in timing, there won't be an (appreciable) UP pulse but will be a DN pulse of a width that represents a timing error of the divided clock with respect to the reference clock.

When the divisor value N is a fixed integer, in a steady state, a timing (e.g., a rising edge) of the divided clock will be well aligned with a timing of the reference clock except for a fixed offset; therefore, the width the DN pulse will be nearly fixed. However, in an application known as a "fractional-N frequency synthesizer," the divisor value N is not a fixed integer and is dynamically dithered. In a case where a target frequency of the VCO clock is $N_0+\alpha$ times the frequency of the reference clock, wherein $N_0$ is a nonzero integer and a is a fractional number greater than 0 but smaller than 1, the divisor value N is dynamically dithered and equal to No plus a carry bit generated by an accumulator 160, which performs a cumulative summing of a in accordance with the divided clock, outputs the carry bit to indicate an occurrence of a carry event when a cumulative sum is greater than or equal to 1, deducts the cumulative sum by 1 when the carry event occurs, and also outputs a residue that is equal to the cumulative sum after the deduction if applicable. The divisor value N is equal to $N_0$ plus the carry bit, thus equal to either $N_0$ or $N_0+1$. The probability that the divisor value N is $N_0+1$ is a, and therefore the frequency of the VCO clock will be $N_0+\alpha$ times the frequency of the reference clock due to that an average timing of the divided clock will still be aligned with the timing of the reference clock. However, an instantaneous timing of the divided clock with respect to the reference clock may vary widely, up to a period of the VCO clock, leading to an instantaneous noise embedded in the error current due to a cycle-to-cycle variation of the width of the DN pulse. The instantaneous noise, however, is deterministic and can be predicted from the residue generated by the accumulator 160.

In a paper "A fractional-N frequency synthesizer architecture utilizing a mismatch compensated PFD/DAC structure for reduced quantization-induced phase noise," IEEE Transactions on Circuits and Systems II: Analog and Digital Signal Processing (Volume: 50, Issue: 11, November 2003), Menninger et al. presented a noise compensation scheme that can effectively suppress the instantaneous noise due to the dithering of the divisor value N. As shown in FIG. 2, the divided clock is re-timed in accordance with the VCO clock using a shift register 220 comprising a first unit-cycle delay (denoted by "$z^{-1}$," which is a notation widely used in a context of discrete-time signal processing) 221 followed by a second unit-cycle delay 222, resulting in a first re-timed clock FB0 and a second re-timed clock FB1. It is clear that FB1 will be the same as FB0 except for a time delay of $T_{vco}$, which denotes a period of the VCO clock. A timing difference between the reference clock and FB0 is detected by a first PFD 211 and represented by a first DN pulse DN0, while a timing difference between the reference clock and FB1 is detected by a second PFD 212 and represented by a second DN pulse DN1. A first DAC (digital-analog converter) 231 is controlled by (1−ε) and configured to output a first current $I_c$ that is equal to $I_{cp}(1-\varepsilon)$, wherein $I_{cp}$ is a fixed current, and ε is a B-bit digital word that quantizes the residue of the accumulator 160 and is of a value between 0 and 1, inclusively, where B is an integer greater than 1.

A second DAC (digital-analog converter) 232 is controlled by ε and configured to output a second current $I_e$ that is equal to $I_{cp}\varepsilon$. The first current $I_c$ and the second current $I_e$ are combined via a first switch 241 and a second switch 242 controlled by DN0 and DN1, respectively. As explained by Menninger et al, ε represents the residue of the accumulator 160 and thus is a predicted value of the width of DN1 (minus a fixed offset that is known beforehand, if applicable) normalized by $T_{vco}$, and a total net charge (which is equal to an integral of the error current) will be $I_{cp}T_{vco}$, regardless of the value of ε, despite that the width of DN1 varies. The compensation scheme, however, is based on using a current pulse of a fixed width (equal to one VCO clock period) but variable height (equal to $I_{cp}(1-\varepsilon)$) to compensate a current pulse of a fixed height (equal to $I_{cp}$) but variable width (equal to the ε times the VCO clock period) so that the total net charge of the current pulse is equal to $I_{cp}T_{vco}$, regardless of ε; however, the time domain waveform is different; therefore, the compensation is not perfect and a time-domain noise is still present due to the difference in the time domain waveform.

In U.S. Pat. No. 7,629,854, Lin et al. disclosed a switch-capacitor loop filter that can eliminate the time-domain noise by integrating the error current using a capacitor that stores a net charge of the error current, sampling the net charge after the end of the DN1 pulse in accordance with a timing of the reference clock, and then transferring the sampled net charge to the loop filter. This way, the time-domain noise becomes invisible to the loop filter and thus irrelevant. The switch-capacitor loop filter disclosed thereof, however, needs an operational amplifier to transfer the sampled net charge to the loop filter; this consumes extra power and also leads to additional circuit noise.

What is desired is a switch-capacitor loop filter that does not need an operational amplifier, and which has low random noise and low deterministic noise.

BRIEF SUMMARY OF THIS INVENTION

An objective of this present disclosure is to compensate a noise of a fractional-N frequency synthesizer in a power efficient manner.

Another objective of this present disclosure is to compensate a noise of a fractional-N frequency synthesizer but refrain from inducing random noise.

Another objective of this present disclosure is to compensate a noise of a fractional-N frequency synthesizer but refrain from inducing deterministic noise.

In an embodiment, a charge pump comprises: a digital-to-analog converter configured to draw a first current and a second current from a first node and a second node, respectively, in accordance with a first logical signal, a second logical, and a B-bit control word, wherein B is an integer greater than one; a common-gate amplifier configured to provide a path for charge transfer between the second node and a third node in accordance with a third logical signal; an integrating capacitor connected to the second node and configured to be either discharged by the digital-to-analog converter or charged by the common-gate amplifier in accordance with a fourth logical signal; and a low-impedance active load connected to the first node, wherein: the first logical signal comprises a first pulse starting at a second time instant that trails a first time instant but leads a third time instant and ending at a fourth time instant that trails the third time instant; the second logical signal comprises a second pulse starting at the third time instant and ending at the fourth time instant; the fourth logical signal comprises a fourth pulse starting at the first time instant and ending no earlier than the fourth time instant; the third logical signal is an inversion of the fourth logical signal; and a value of the B-bit control word remains fixed during a time window of the fourth pulse.

DETAILED DESCRIPTION OF THIS INVENTION

The present invention relates to charge pumps in a fractional-N frequency synthesizer. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

A common-gate amplifier is embodied by a MOST configured to receive an input current from its source and output an output current via its drain, wherein its gate is connected to a bias node, a voltage at which is equal to a bias voltage that is substantially stationary in a time window of interest.

A circuit is a collection of a transistor, a capacitor, an inductor, a resistor, and/or other electronic devices interconnected in a certain manner to embody a certain function. A network is a circuit or a collection of circuits configured to embody a certain function.

In this present disclosure, a "circuit node" is simply referred to as a "node" for short, as the meaning is clear from a context of microelectronics and won't cause confusion.

In this present disclosure, a signal is a voltage of a variable level that can vary with time. A (voltage) level of a signal at a moment represents a state of the signal at that moment.

A logical signal is a signal of two states: a low state and a high state. The low state is also referred to as a "0" state, while the high stage is also referred to as a "1" state. Regarding a logical signal Q, "Q is high" or "Q is low," means that "Q is in the high state" or "Q is in the low state." Likewise, "Q is 1" or "Q is 0," means that "Q is in the 1 state" or "Q is in the 0 state."

When a logical signal toggles from low to high, it undergoes a low-to-high transition and a rising edge occurs. When a logical signal toggles from high to low, it undergoes a high-to-low transition and a falling edge occurs. A pulse of a logical signal starts at a rising edge and ends at a subsequent falling edge.

A first logical signal is said to be a logical inversion of a second logical signal if the first logical signal and the second logical signal are always in opposite states. That is, when the first logical signal is 0 (low), the second logical signal is 1 (high); when the first logical signal is 1 (high), the second logical signal is 0 (high). When a first logical signal is a logical inversion of a second logical signal, the first logical signal and the second logical signal are said to be complementary to one another.

A clock is a logical signal that cyclically toggles back and forth between a low state and a high state.

Figure 1:
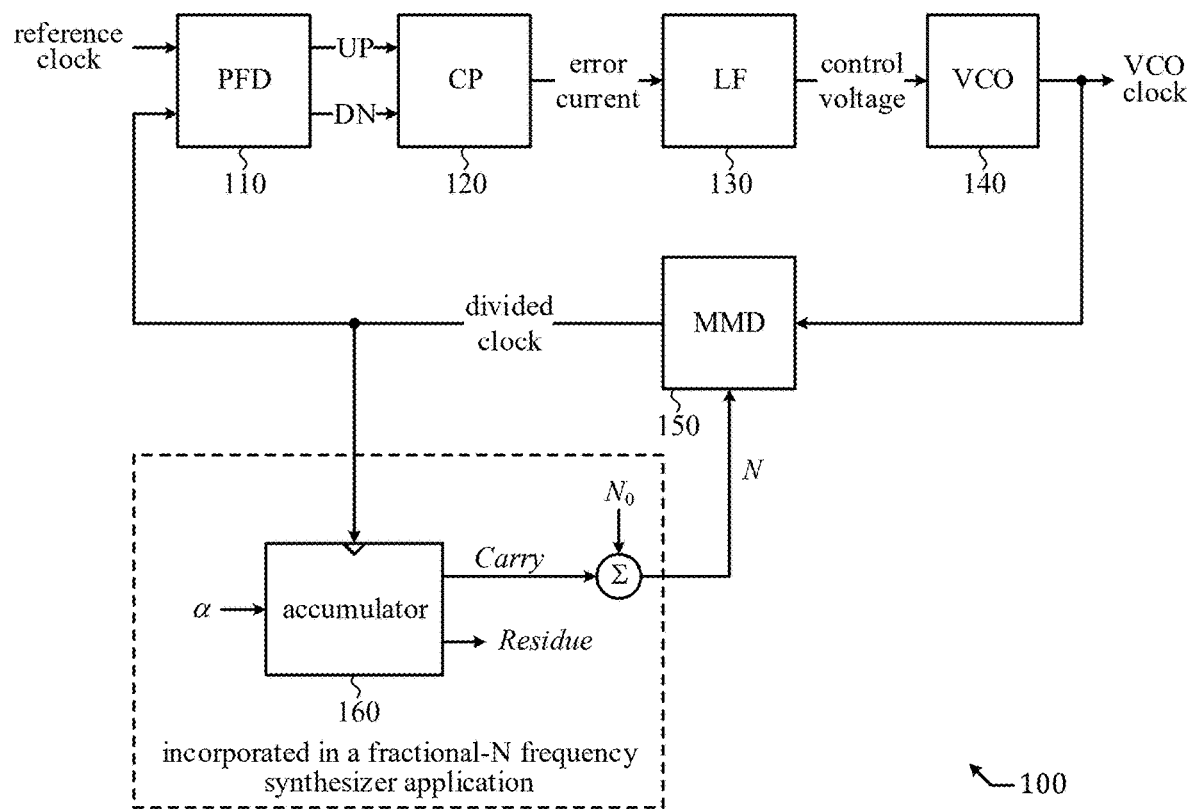
FIG. 1 shows a functional block diagram of a conventional PLL (phase lock loop).
Figure 2:
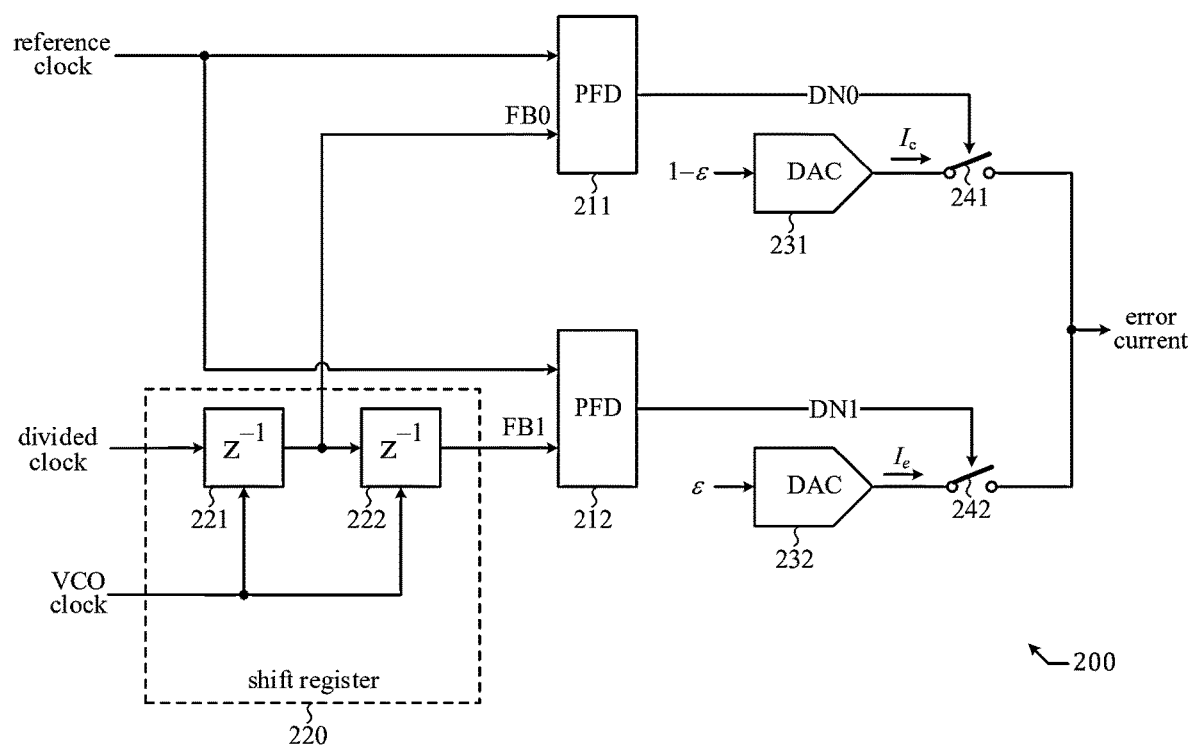
FIG. 2 shows a functional block diagram of a conventional PFD/DAC circuit that can be used to compensate a noise of fractional-N frequency synthesizer.
Figure 3:
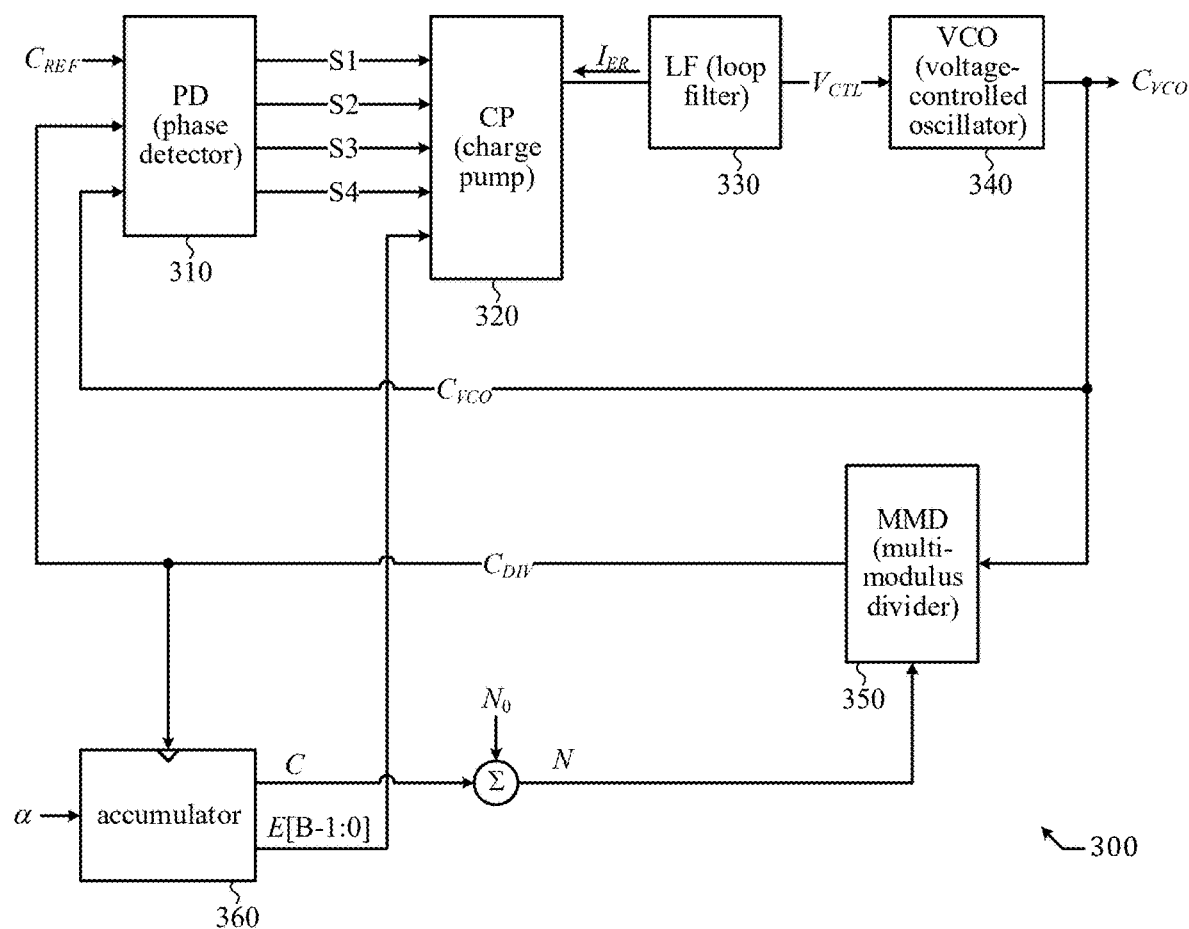
FIG. 3 shows a functional block diagram of a fractional-N frequency synthesizer in accordance with an embodiment of the present disclosure.

A functional block diagram of a FNFS (fractional-N frequency synthesizer) 300 in accordance with an embodiment of the present disclosure is shown in FIG. 3. The FNFS 300 comprises: a PD (phase detector) 310 configured to receive a reference clock $C_{REF}$, a divided clock $C_{DIV}$, and a VCO clock $C_{VCO}$ and output four logical signals S1, S2, S3, and S4; a CP (charge pump) 320 configured to receive the four logical signals S1, S2, S3, and S4 along with a B-bit control word E[B−1:0] and establish an error current $I_{ER}$, a LF (loop filter) 330 configured to output a control voltage $V_{CTL}$ in response to the error current $I_{ER}$, a VCO (voltage controlled oscillator) 340 configured to output the VCO clock $C_{VCO}$ in response to the control voltage $V_{CTL}$, a MMD (multi-modulus divider) 350 configured to receive the VCO clock $C_{VCO}$ and output the divided clock $C_{DIV}$ in accordance with a divisor value N, which is equal to a fixed integer $N_0$ plus a carry bit C; and an accumulator 360 configured to receive a fractional number α and output the carry bit C along with the B-bit control word E[B−1:0], which is a quantized value of a residue of a cumulative sum of the fractional number α, in accordance with the divided clock.

Figure 4A:
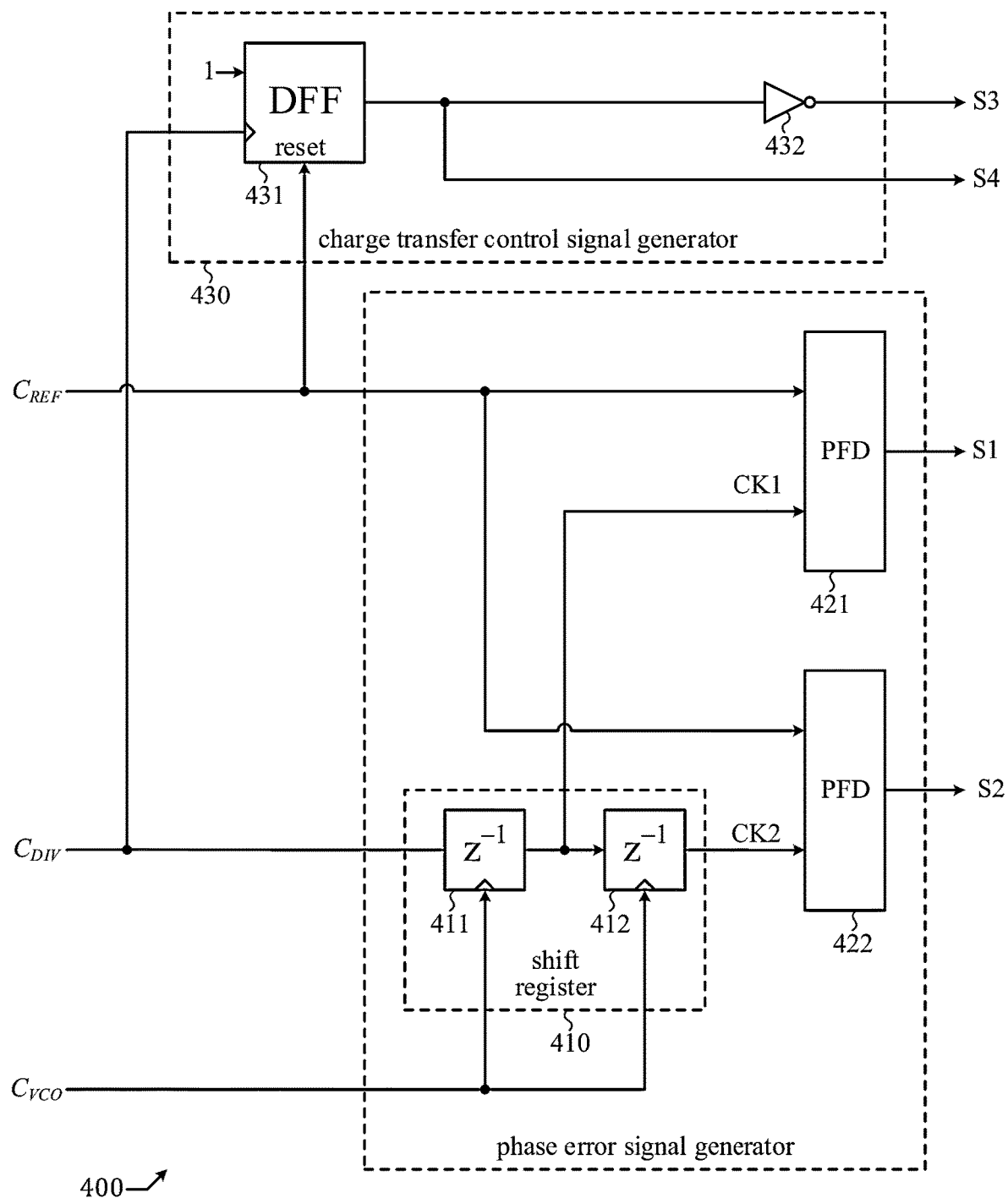
FIG. 4A shows a schematic diagram of a phase detector that can be used in the fractional-N frequency synthesizer of FIG. 3 in accordance with an embodiment of the present disclosure.

A schematic diagram of a PD (phase detector) 400 that can be used to embody PD 310 is shown in FIG. 4A. The PD 400 comprises: a shift register 410 comprising two unit-cycle delays 411 and 412 cascaded and configured to receive $C_{DIV}$ and output two re-timed clocks CK1 and CK2, respectively, in accordance with a timing of $C_{VCO}$; a first PFD (phase/frequency detector) 421 configured to output S1 to represent a time difference between $C_{REF}$ and CK1; a second PFD 422 configured to output S2 to represent a time difference between $C_{REF}$ and CK2; a charge transfer control signal generator 430 comprising a DFF (data flip flop) 431 configured to reset S4 to 0 when $C_{REF}$ is high and set S4 to 1 upon a rising edge of $C_{DIV}$, and an inverter 432 configured to receive S4 and output S3, so that S3 is a logical inversion of S4.

Figure 4B:
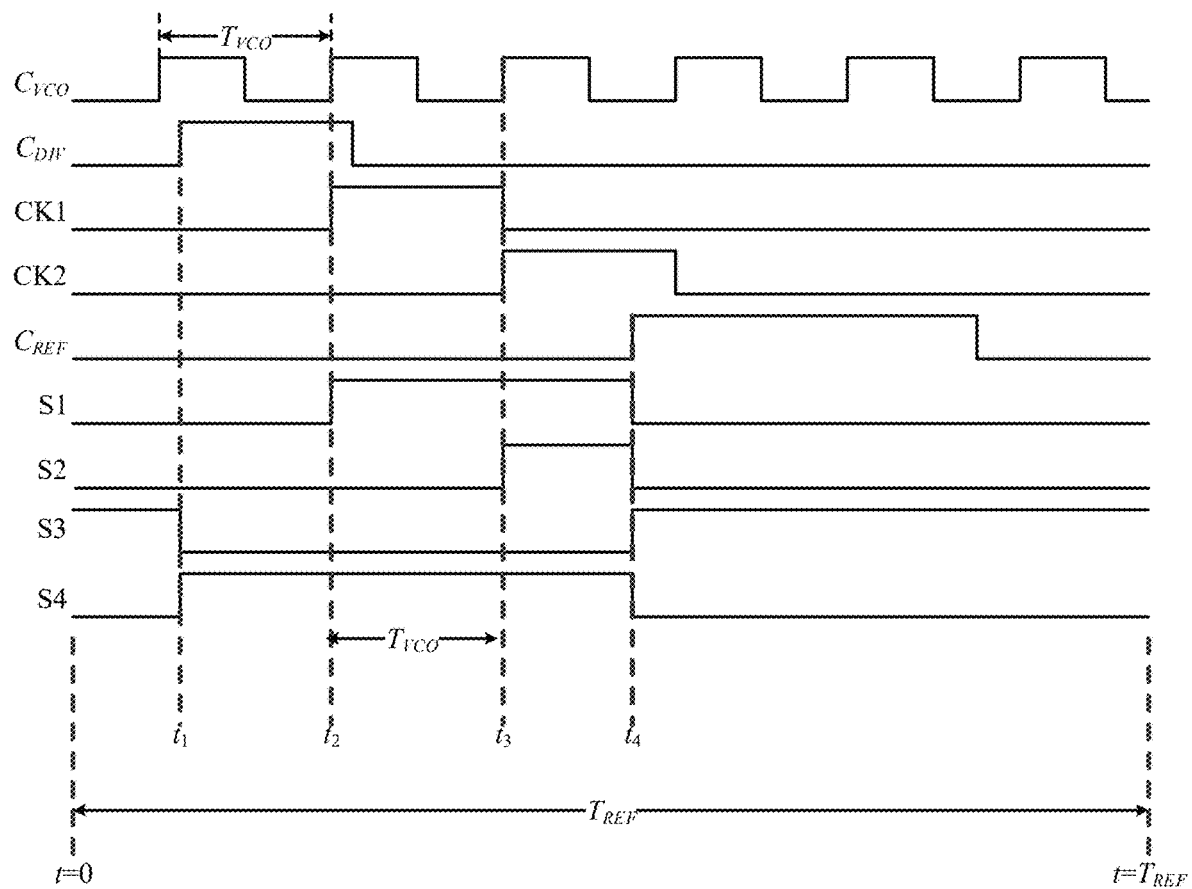
FIG. 4B shows a timing diagram of the phase detector of FIG. 4A.

PD 400 works in a cyclical manner in an accordance with $C_{REF}$. A timing diagram of the PD 400 in a $C_{REF}$ cycle is shown in FIG. 4B. As shown, $C_{VCO}$ is periodic with a period $T_{VCO}$, and there are $N_0$ or $N_0+1$ pulses of $C_{VCO}$ for every $C_{REF}$ cycle; in the particular case shown in FIG. 4B, $N_0$ is 6. MMD 350 divides down $C_{VCO}$ to generate $C_{DIV}$, resulting in a rising edge of $C_{DIV}$ at a first time instant $t_1$, and consequently prompting DFF 431 to incur a rising edge of S4. The unity-cycle delay ("$z^{-1}$") 411 samples $C_{DIV}$ in accordance with $C_{VCO}$ to generate CK1, resulting in a rising edge of CK1 at a second time instant $t_2$ that aligns with a rising edge of $C_{VCO}$, and consequently prompting PFD 421 to generate a rising edge of S1 at the second time instant $t_2$. The unit-cycle delay ("$z^{-1}$") 412 samples CK1 in accordance with $C_{VCO}$ to generate CK2, resulting in a rising edge of CK2 at a third time instant $t_3$ that aligns with a subsequent rising edge of $C_{VCO}$, and consequently prompting PFD 422 to generate a rising edge of S2 at the third time instant $t_3$. A rising edge of a pulse of $C_{REF}$ comes a fourth time instant $t_4$, prompting DFF 431 to reset S4 and thus leading to a falling edge of S4, prompting PFD 421 to reset S1 and thus lead to a falling edge of S1, and also prompting PFD 422 to reset S2 and thus leading to a falling edge of S2, all occurring upon the fourth time instant $t_4$. Also, S3 is a logical inversion of S4, and thus has a falling edge at $t_1$ and a rising edge at $t_4$.

Note that E[B−1:0] is updated upon a rising edge of $C_{DIV}$, which occurs before a pulse of S1 and a pulse S2 and remains the same until a next rising edge of $C_{DIV}$. Therefore, during a time window of the pulse of S1 and the pulse of S2, the value of [B−1:0] remains fixed; this condition is important to ensure the noise compensation is carried out correctly.

Figure 5A:
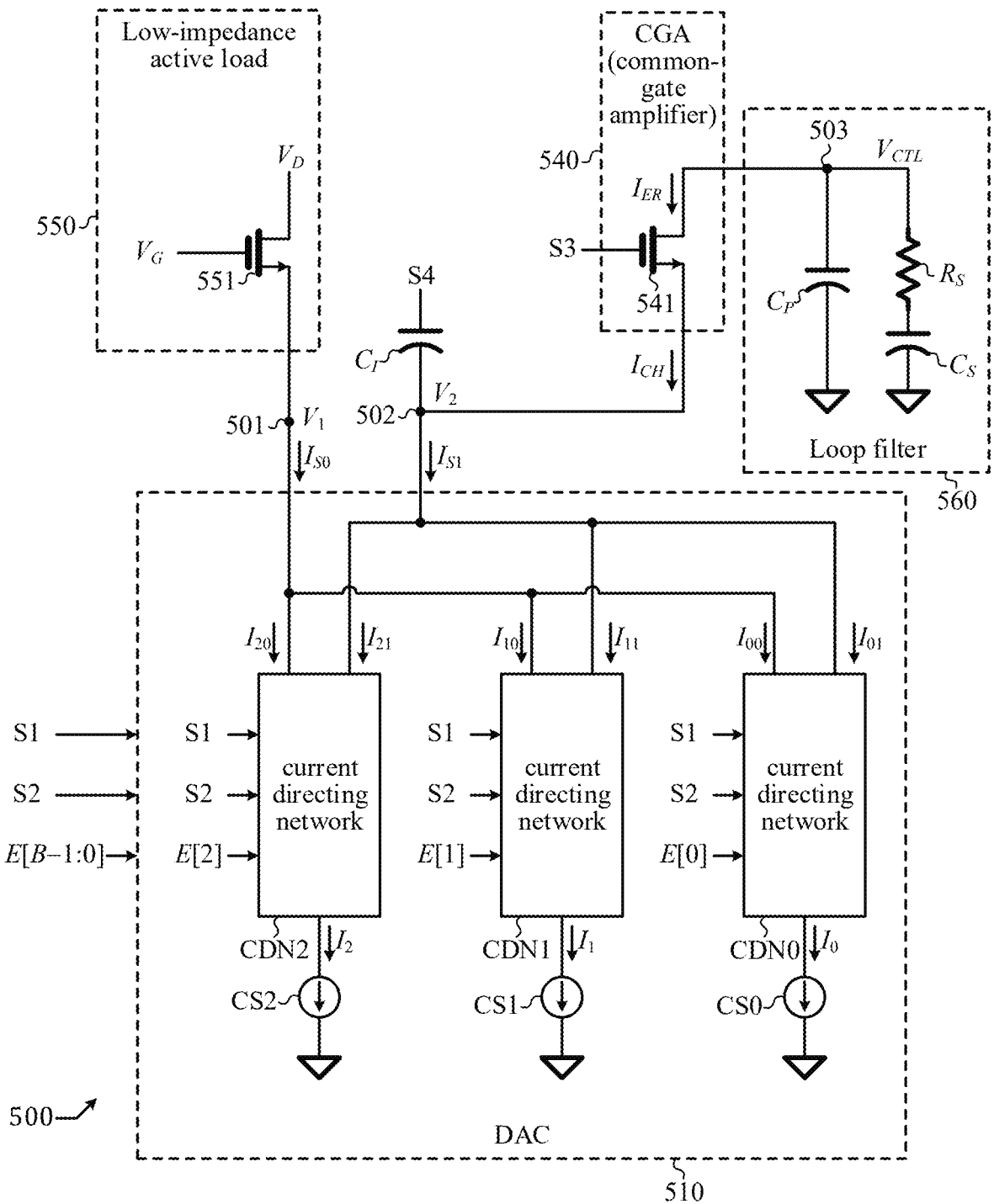
FIG. 5A shows a schematic diagram of a charge pump that can be used in the fractional-N frequency synthesizer of FIG. 3 in accordance with an embodiment of the present disclosure.

As shown in FIG. 5A, a CP (charge pump) 500 in accordance with an embodiment of the present disclosure that can be used to embody the CP 320 comprises: a DAC (digital-to-analog converter) 510 configured to draw a first current $I_{S0}$ and a second current $I_{S1}$ from a first node 501 and a second node 502, respectively, in accordance with S1, S2, and E[B−1:0]; a CGA (common-gate amplifier) 540 configured to provide a charge transfer path between the second node 502 and a third node 503 in accordance with S3; an integrating capacitor $C_I$ configured to be either discharged by the DAC 510 through the second current $I_{S1}$ or charged by the CGA 540 through a charging current $I_{CH}$ in accordance with S4; and a low-impedance active load 550 connected to the first node 501.

By way of example but not limitation, B is 3, and DAC 510 comprises: three current sources CS0, CS1, and CS2 configured to draw three tail currents $I_0$, $I_1$, and $I_2$, respectively; three current directing networks CDN0, CDN1, and CDN2, wherein CDN0 directs either a current $I_{00}$ from the first node 501 or to a current $I_{01}$ from the second node 502 into $I_0$ in accordance with S1, S2, and E[0], CDN1 directs either a current $I_{10}$ from the first node 501 or a current $I_{11}$ from the second node 502 into $I_1$ in accordance with S1, S2, and E[1], and CDN2 directs either a current $I_{20}$ from the first node 501 or to a current $I_{21}$ from the second node 502 into $I_2$ in accordance with S1, S2, and E[2]. The first current $I_{S0}$ is a sum of currents $I_{00}$, $I_{10}$, and $I_{20}$, while the second current $I_{S1}$ is a sum of currents $I_{01}$, $I_{11}$, and $I_{21}$.

Figure 5B:
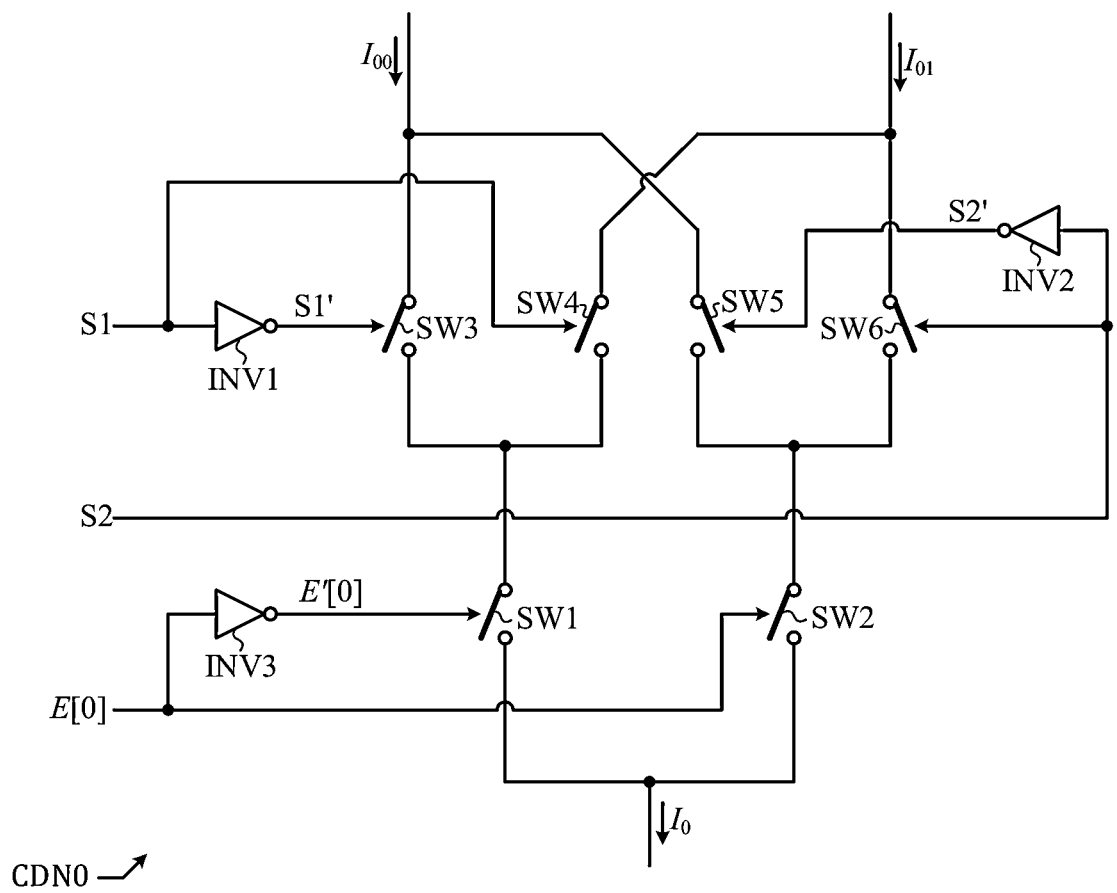
FIG. 5B shows a schematic diagram of a current directing network that can be used in the charge pump of FIG. 5A in accordance with an embodiment of the present disclosure.

As shown in FIG. 5B, in an embodiment, the current directing network CDN0 comprises: three inverters INV1, INV2, and INV3 configured to receive S1, S2, and E[0], and output logical inversions S1', S2', and E'[0], respectively;

and six switches SW1, SW2, SW3, SW4, SW5, and SW6 controlled by E'[0], E[0], S1', S1, S2', and S2 respectively. At any moment, one of $I_{00}$ and $I_{01}$ is directed to $I_0$ through two switches: $I_{00}$ is directed to $I_0$ through SW3 and SW1 when S1' and E'[0] are both high, or through SW5 and SW2 when S2' and E[0] are both high, while $I_{01}$ is directed to $I_0$ through SW4 and SW1 when S1 and E'[0] are both high, or though SW6 and SW2 when S2 and E[0] are both high. The same circuit of CDN0 can be used to embody CDN1 (CDN2), by changing E[0], E'[0], $I_0$, $I_{00}$, and $I_{01}$ to E[1](E [2]), E'[1](E'[2]), $I_1$ ($I_2$), $I_{10}$ ($I_{20}$), and $I_{11}$ ($I_{21}$), respectively.

The four logical signals S1, S2, S3, and S4 are all periodic and recurring in accordance with $C_{REF}$, and what are shown in FIG. 4B are their time-domain waveforms within a present cycle starting from time instant t=0 to time instant t=$T_{REF}$ wherein $T_{REF}$ is a period of $C_{REF}$. Within the present cycle, a pulse of S1 starts at $t_2$ and ends at $t_4$, a pulse of S2 starts at $t_3$ and ends at $t_4$, and a pulse of S4 starts at $t_1$ and ends at $t_4$, while S3 is a logical inversion of S4. Note that $t_1$, $t_2$, $t_3$, and $t_4$ are sequential in time. When S4 is high (and S3 is low), the charge pump 500 is in a discharging phase, wherein the CGA 540 is turned off, a top plate of the integrating capacitor $C_I$ is pulled high by S4, and the integrating capacitor $C_I$ is discharged by $I_{S1}$ drawn by DAC 510 when S1 and S2 are both high or S1 is high but S2 is low. When S4 is low (and S3 is high), the charge pump 320 is in a transfer phase, wherein the CGA 540 is turned on, a top plate of the integration capacitor $C_I$ is pulled low by S4, and the integration capacitor $C_I$ is charged by the charging current $I_{CH}$ from the common-gate amplifier 540, which comes from the error current $I_{ER}$ that draws charge from a loop filter 560, which is an embodiment of LF 330 and comprises a parallel connection of a shunt capacitor $C_P$ with a serial connection of a serial resistor $R_S$ and a serial capacitor $C_S$. Also, note that between time instant 0 and $t_1$, the charge pump 500 is in a transfer phase that is continued from a preceding cycle, while between time instant $t_4$ and $T_{REF}$, the charge pump 500 is in a transfer phase that will be continued to a succeeding cycle. During the transfer phase, S1 and S2 are both low, $I_{S1}$ is zero, $I_{S0}$ is a sum of $I_0$, $I_1$, and $I_2$.

The CGA 540 comprises a first NMOST 541 with a gate controlled by S3, a source connected to the second node 502, and a drain connected to the third node 503. The low-impedance active load 550 comprises a second NMOST 551 with a gate controlled by a gate voltage $V_G$, a source connected to the first node 501, and a drain connected to a drain voltage $V_D$. The low-impedance active load 550 is used to provide a low impedance at the first node 501, so that a voltage $V_1$ at the first node 501 can be kept to a level that can be steady in the transfer phase; this ensures the initial condition of the charge pump 500 is consistent and signal independent (i.e., independent of S1, S2, S3, S4, and E[B−1:0]). Note that $V_G$ needs to be sufficiently high to turn on NMOST 551, and $V_D$ needs to be not lower than $V_G$ by more than a threshold voltage of NMOST 551; this way, NMOST 551 can remain in the saturation region and be effective in providing a low impedance.

The combination of PD 310 (as embodied by PD 400) and CP 320 (as embodied by CP 500) offers a few advantages. First, like U.S. Pat. No. 7,629,854, the time-domain noise resulting from using a pulse of a fixed width but variable height to compensate a pulse of a fixed height but variable width becomes invisible to the loop filter and thus irrelevant, due to using the two-phase scheme (in accordance with S4 and S3) that synchronizes the charge transfer of the error current to LF 330. An objective of eliminating the time-domain instantaneous noise, which is deterministic, is achieved. Second, unlike U.S. Pat. No. 7,629,854, no operational amplifier is needed; this helps to avoid added random noise and power consumption that accompany with the use of operational amplifier. Third, due to using the noise compensation scheme (using DAC 510 in accordance with E [B−1:0] that is a quantized value of a predicted timing of $C_{DIV}$), a total charge of the integrating capacitor $C_I$ drawn by $I_{S1}$ in the discharging phase is compensated and is thus nearly constant and has small cycle-to-cycle variation, provided the quantization of the compensation (i.e. the value of B) is sufficiently fine. A voltage $V_2$ at the second node 502 at the end of the discharging phase thus has small cycle to cycle variation. In the transfer phase, a charge will be drawn from LF 330 via $I_{ER}$ and results in $I_{CH}$ until $V_2$ rises to a level that causes NMOST 541 to be shut off. At the end of the transfer phase, $V_2$ will be of approximately a voltage level of S3 minus a threshold voltage of NMOST 541, which is also nearly constant and has very small cycle-to-cycle variation. Since $V_2$ has small cycle-to-cycle variation, an adverse effect of a circuit nonlinearity associated with DAC 500 and the CGA 540 is therefore small. This also helps to reduce a deterministic noise resulting from the circuit nonlinearity.

Note that PD 400 is just an exemplary embodiment for generating S1, S2, S3, and S4 in accordance with $C_{VCO}$, $C_{REF}$, and $C_{DIV}$, and numerous modifications and alterations can be used. In any case, what is needed is to ensure a rising edge of S4 must occur no later than a rising edge of S1, and a falling edge of S4 must occur no earlier than a rising edge of $C_{REF}$; this is the condition needed to ensure the sanity of the CP 320.

Switch, PFD, inverter, accumulator, DFF, unity-cycle delay ($z^{-1}$), and current source are all well known in the prior art and thus not explained in detail. Circuit designers can freely choose a variety of circuits known in the prior art at their discretions.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:
1. A divisor ratio charge pump comprising:
a DAC (digital-to-analog converter) configured to draw a first current and a second current from a first node and a second node, respectively, in accordance with a first logical signal, a second logical, and a B-bit control word, wherein B is an integer greater than one;
a CGA (common-gate amplifier) configured to provide a path for charge transfer between the second node and a third node in accordance with a third logical signal;
an integrating capacitor connected to the second node and configured to be either discharged by the DAC or charged by the CGA in accordance with a fourth logical signal; and
a low-impedance active load connected to the first node, wherein:
the first logical signal comprises a first pulse starting at a second time instant that trails a first time instant but leads a third time instant and ending at a fourth time instant that trails the third time instant;
the second logical signal comprises a second pulse starting at the third time instant and ending at the fourth time instant;

the fourth logical signal comprises a fourth pulse starting at the first time instant and ending no earlier than the fourth time instant;

the third logical signal is an inversion of the fourth logical signal; and a value of the B-bit control word remains fixed during a time window of the fourth pulse.

2. The charge pump of claim 1, wherein the DAC comprises B current sources configured to draw B tail currents directed by B current steering networks, each of which is controlled by a respective bit of the B-bit control word along with the first logical signal and the second logical to determine whether a respective tail current is directed from the first node or the second node.

3. The charge pump of claim 2, wherein the respective tail current is directed from the first node when both the first logical signal and the respective bit are low, or when the second logical signal is low and the respective bit is high, and the respective tail current is directed from the second node when both the second logical signal and the respective bit are high, or when the first logical signal is high and the respective bit is low.

4. The charge pump of claim 1, wherein the low-impedance active load comprises a NMOST (n-channel metal-oxide semiconductor transistor), of which a source is connected to the first node, a gate is controlled by a gate voltage that is sufficiently high to turn on the NMOST, and a drain is connected to a drain voltage that is not lower than the gate voltage by more than a threshold voltage of the NMOST.

5. The charge pump of claim 1, wherein the CGA comprises a NMOST (n-channel metal-oxide semiconductor transistor), of which a source is connected to the second node, a gate is controlled by the third logical signal, and a drain is connected to the third node.

6. The charge pump of claim 1, wherein the first logical signal, the second logical signal, the third logical signal, and the fourth logical are generated by a phase detector configured to detect a first timing difference between a reference clock and a first re-timed clock and a second timing difference between the reference clock and a second re-timed clock, the first re-timed clock and the second re-timed clock, wherein the second re-timed clock is established by re-timing a divided clock in accordance with a VCO (voltage-controlled oscillator) clock, and the divided clock is generated by dividing down the VCO clock using a MMD (multi-modulus divider) in accordance with a divisor value.

7. The charge pump of claim 6, wherein the second re-timed clock is the same as the first re-timed clock except for a delay of one VCO clock period.

8. The charge pump of claim 7, wherein the divisor ratio is equal to a fixed integer plus a carry bit generated by an accumulator.

9. The charge pump of claim 8, wherein the accumulator performs a cumulative summing of a fractional number greater than 0 but smaller than 1 in accordance with the divided clock, outputs the carry bit to indicate an occurrence of a carry event when a cumulative sum is greater than or equal to 1, deducts the cumulative sum by 1 when the carry event occurs, and quantizes the cumulative sum into the B-bit control word.

10. The charge pump of claim 9, wherein the first time instant is associated with a rising edge of the divided clock, the second time instant is associated with a rising edge of the first re-timed clock, the third time instant is associated with a rising edge of the second re-timed clock, and the fourth time instant is associated with a rising edge of the reference clock.

11. The charge pump of claim 10, wherein the third node connects to a loop filter comprising a parallel connection of a shunt capacitor with a serial connection of a series resistor and a series capacitor.

12. The charge pump of claim 11, wherein a voltage at the third node is used to control a VCO (voltage-controlled oscillator) configured to output the VCO clock.

* * * * *